United States Patent
McGee et al.

(10) Patent No.: US 6,265,874 B1
(45) Date of Patent: Jul. 24, 2001

(54) AUTOCORRECTION OF MR IMAGES USING MULTIPLE METRICS

(75) Inventors: Kiaran McGee; Joel P. Felmlee; Richard L. Ehman; Armando Manduca, all of Rochester, MN (US)

(73) Assignee: Mayo Foundation For Medical Education and Research, Rochester, MN (US)

( * ) Notice: Subject to any disclaimer, the term of this patent is extended or adjusted under 35 U.S.C. 154(b) by 0 days.

(21) Appl. No.: 09/576,191

(22) Filed: May 23, 2000

(51) Int. Cl.$^7$ .................................................. G01V 3/00
(52) U.S. Cl. ................................. 324/312; 324/306
(58) Field of Search .......................... 324/306, 307, 324/309, 312, 314, 300; 364/419.13; 600/410, 407; 358/447

(56) References Cited

U.S. PATENT DOCUMENTS

| | | | |
|---|---|---|---|
| 5,432,447 | * 7/1995 | Song | 324/309 |
| 5,568,384 | * 10/1996 | Robb et al. | 364/419.13 |
| 5,767,987 | * 6/1998 | Wolff et al. | 358/447 |

OTHER PUBLICATIONS

Autofocusing of Clinical Shoulder MR Images for Correction of Motion Artifacts, Mayo Clinic, Rochester MN, Manduca, et al. (date unknown).

Automatic Correction of Motion Artifacts in Magnetic Resonance Images Using an Entropy Focus Criterion, IEEE Transactions on Medical Imaging, vol. 16, No. 6, Dec. 1997, Atkinson, et al.

An Autofocus Algorithm for the Automatic Correction of Motion Artifacts in MR Images, Lecture Notes in Computer Science, 15$^{th}$ International Conference, IPMI '97, Atkinson, et al.

A Respiratory Motion Artifact Reduction Method In Magnetic Resonance Imaging of the Chest, IEEE Transactions on Medical Imaging, vol. 10, No. 1, Mar. 1991, Atalar, et al.

Motion Artifact Suppression: A Review of Post–Processing Techniques, MRI, vol. 10, pp. 627–635, 1992, Hedley, et al.

Diffusion–Weighted Multiple Shot Echo Planar Imaging of Humans without Navigation, MRM 38 82–88 1997, Robson, et al.

MRI Artifact Cancellation Due to Rigid Motion in the Imaging Plane, IEEE Transactions on Medical Imaging, vol. 15, No. 6, Dec. 1996, Zoroofi, et al.

An Improved Algorithm for 2–D Translation Motion Artifact Correction, IEEE Transaction on Medical Imaging, vol. 10, No. 4, Dec. 1991, Hedley, et al.

* cited by examiner

Primary Examiner—Louis Arana
(74) Attorney, Agent, or Firm—Quarles & Brady, LLP

(57) ABSTRACT

An MRI image is corrected for motion artifacts using an iterative, autocorrection process in which corrections are tried and the quality of the resulting reconstructed image is measured. Different metrics for evaluating image quality are used during the autocorrection process to take advantage of their different attributes.

11 Claims, 3 Drawing Sheets

AUTOCORRECTION OF MR IMAGES USING MULTIPLE METRICS

BACKGROUND OF THE INVENTION

The field of the invention is nuclear magnetic resonance imaging methods and systems. More particularly, the invention relates to the correction of motion artifacts in MR images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition.

Another proposed method for eliminating ghost artifacts is disclosed in U.S. Pat. No. 4,567,893, issued on Feb. 4, 1986. This prior patent teaches that the distance in the image between the ghosts and the object being imaged is maximized when the NMR pulse sequence repetition time is an odd multiple of one-fourth of the duration of the periodic signal variation. This can be used to alleviate ghosts due to respiratory motion. While this method, indeed, improves image quality, it does impose a constraint on the NMR pulse sequence repetition time and it often results in a longer total scan time. It also assumes that the motion is periodic.

Yet another method for reducing the undesirable effects due to periodic signal variations is disclosed in U.S. Pat. No. 4,706,026 issued on Nov. 10, 1987 and entitled "A Method For Reducing Image Artifacts Due To Periodic Variations In NMR Imaging." In one embodiment of this method, an assumption is made about the signal variation period (e.g. due, for example, to patient respiration) and the view order is altered from the usual monotonically increasing phase-encoding gradient to a preselected order. For a given signal variation period, a view order is chosen so as to make the NMR signal variation as a function of the phase-encoding amplitude be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which is entitled "A Method For Reducing Image Artifacts Due To Periodic Signal Variations in NMR Imaging." In this method, the non-monotonic view order is determined as the scan is executed and is responsive to changes in the period so as to produce a desired relationship (low frequency or high frequency) between the signal variations and the gradient parameter. The effectiveness of this method, of course, depends upon the accuracy of the means used to sense the patient motion, and particularly, any variations in the periodicity of that motion.

Yet another method for reducing motion artifacts in NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling".

The most successful method for correcting MR images for motion artifacts employs navigator signals acquired during the scan. As described in U.S. Pat. No. 4,937,526, such navigator signals are acquired periodically during the scan, and the information in these signals may be used to correct the image data for patient motion. Unfortunately, acquisition of the navigator signals increases the scan time.

An automatic correction method has been proposed by D. Atkinson et al., "Information Processing in Medical Imaging", P. 341–354, 1997 in which the entropy of the reconstructed image is examined as a focus criterion by which to iteratively adjust motion estimate. This prior method, due to the properties of entropy, works mostly by making dark areas as dark as possible (thus removing ghosting), but does not use much information from the bright areas of the image. While this method works well on simple test images, clinical MR images often do not become as sharp as they should be and the processing time may be very long.

The clinical application of the autocorrection method has been made possible by the discovery of improved metrics used to evaluate the quality of the image during each iteration. A number of such metrics are disclosed in co-pending PCT patent application No. PCT/US99/08123 filed on Apr. 14, 1999 and entitled "Autocorrection of MR Images for Motion Artifacts." A number of different metrics having different characteristics are disclosed in the pending application, but only one of them is selected for use in the described autocorrection method.

SUMMARY OF THE INVENTION

The present invention is an autocorrection method in which a set of views are acquired to form an image data set; and the views are corrected in an iterative process in which an image is reconstructed from the views; a metric is selected; the quality of the image is evaluated using the selected metric and a further correction is made to the views, wherein the metric selected changes during the iterative process.

It has been discovered that individual metrics are sensitive to specific spatial frequency ranges. For example, some metrics such as entropy work better than others when the central k-space views (low spatial frequencies) objects are being corrected. Other metrics such as gradient entropy work better when correcting higher order k-space views (high spatial frequencies).

Also, some metrics work best to correct for large errors in the acquired NMR data, whereas other metrics excel when the errors are relatively small. By using the present invention, the optimal metric may be selected from a library of available metrics as the autocorrection process progresses.

GENERAL DESCRIPTION OF THE INVENTION

The success of the autocorrection method depends upon the appropriate choice of an image quality metric. A good metric for autocorrection must not only show appropriate improvement as blurring and ghosting are reduced but, more importantly, must correlate well with an expert observer's opinion of image quality. A number of new metrics based on the gradient of the image have been developed. One of these is the entropy of the gradient of the image. This quantity is minimized when the image consists of areas of uniform brightness, separated by sharp edges, since in such a case, the gradient is zero everywhere except at the edges, where it has high values. This is a fairly good model for what is expected in MR images of the body in ideal situations. Any blurring or ghosting will increase the entropy of the gradient, since the gradient will be non-zero at more points and will take on smaller values at the actual edge location. One preferred cost function, or metric (F), applies a one-dimensional gradient operator along the phase encoding direction and then calculates the entropy of this gradient.

$$F = -\sum_{ij} h_{ij} \log_2 [h_{ij}] \quad (1)$$

where:

$$h_{i,j} = \sum_{ij} \left( \frac{\left| \begin{bmatrix} 1 \\ -1 \end{bmatrix} * g_{i,j} \right|}{\sum_{ij} \left| \begin{bmatrix} 1 \\ -1 \end{bmatrix} * g_{i,j} \right|} \right)$$

$g_{ij}$=value at image pixel located at row i and column j.

The best situation to use this metric includes images where the object fills a majority of the field of view and where motion is large enough to distort high resolution structures within the image, but not large enough motion to produce significant ghosts or artifacts outside of the object. For example, in high resolution imaging of the shoulder, motion on the order of 2 mm can occur causing such a scenario.

Another preferred metric is the image entropy which also yields very good results.

$$F_6 = -\sum_{ij} h_{i,j} \log_2 [h_{i,j}] \quad (3)$$

where (3)

$$h_{i,j} = \frac{g_{i,j}}{\sum_{ij} g_{i,j}^2}$$

Entropy is best suited for those situations where motion is large enough to produce ghosting artifacts outside of the object, and where the object is "small" with respect to the field of view. For example, sagittal or axial head image, where the head is surrounded by air (i.e. minimum signal).

These and other useful metrics are stored in a library for use during the autocorrection process. During each iteration of the autocorrection process, one of these stored metrics is selected based on the known conditions and used to measure image quality. The particular metric used, therefore, may change many times during the autocorrection process.

DESCRIPTION OF THE PREFERRED EMBODIMENT

Figure 1:
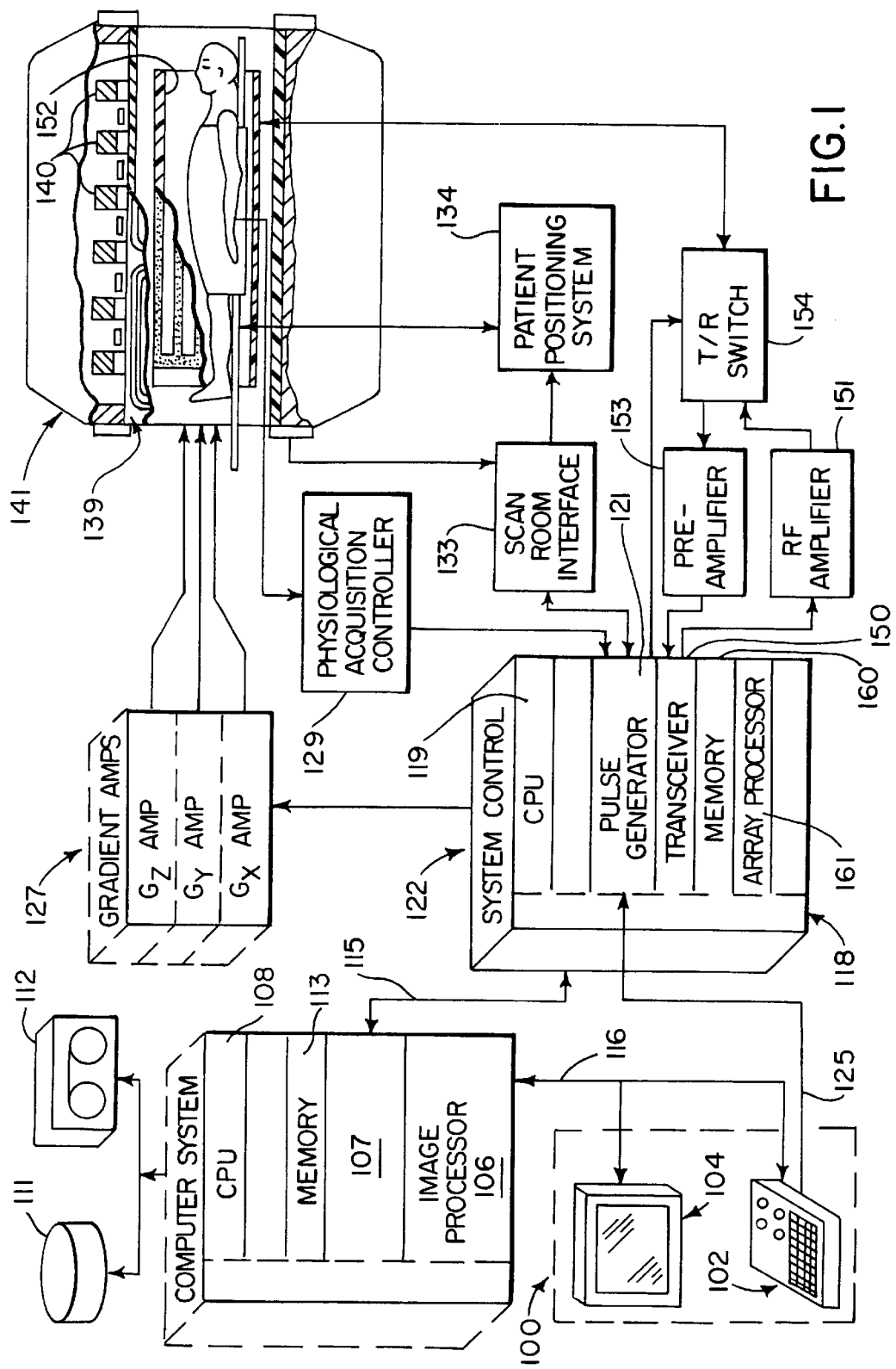
FIG. 1 is a block diagram of an MRI system which employs the present invention.

Referring first to FIG. 1, there is shown the major components of a referred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 2:
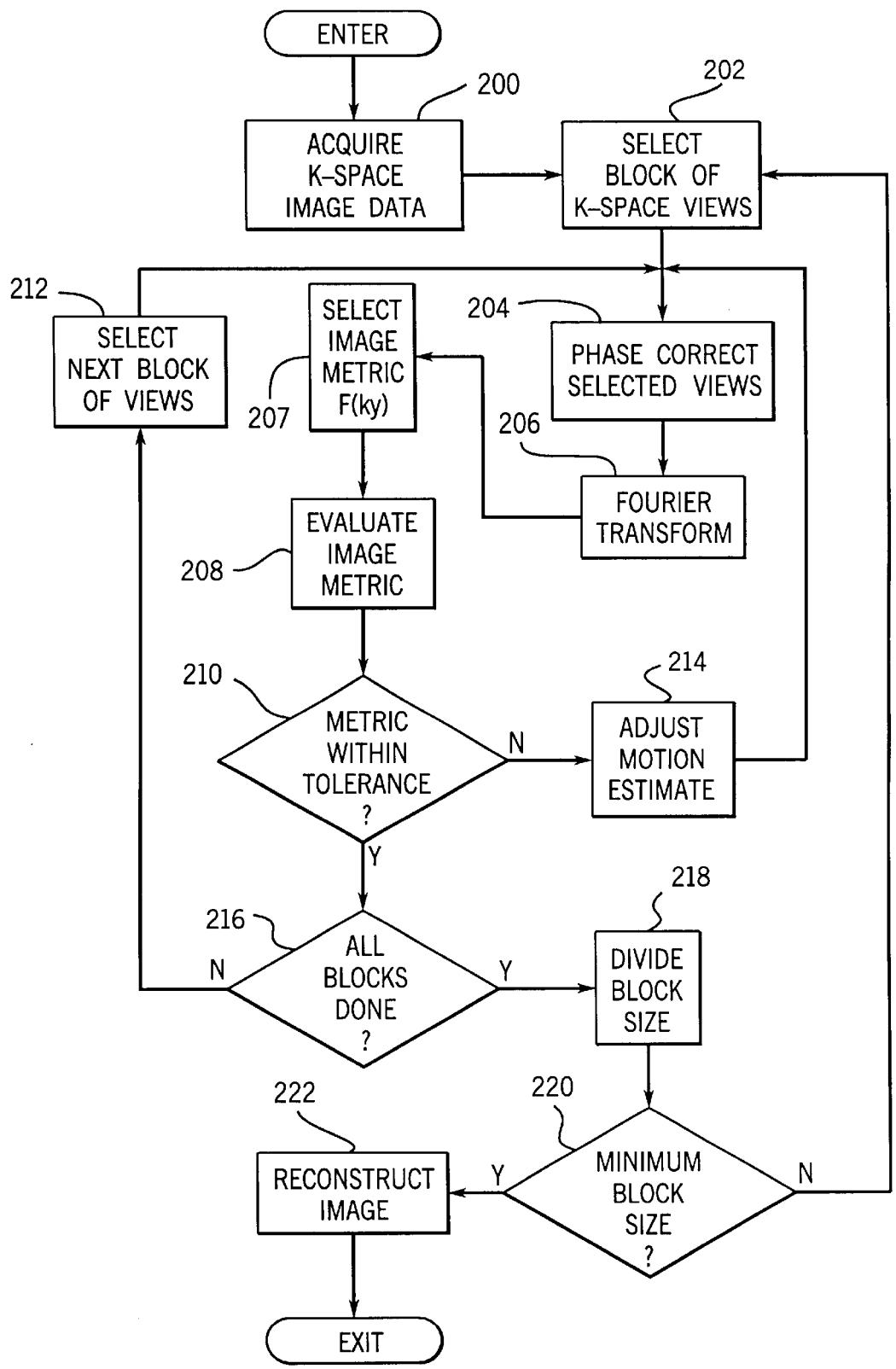
FIG. 2 is a flow chart of the preferred autocorrection method employed by the MRI system of FIG. 1.

The autocorrection method is employed to reduce image artifacts in k-space image data sets acquired with the MRI system of FIG. 1. Referring particularly to FIG. 2, after a k-space image data set is acquired as indicated at process block 200, an initial block of k-space views is selected for correction as indicated at process block 202. In the preferred embodiment 64 views are selected in this initial block. The views in this block are then phase shifted as indicated at process block 204 based on an initial motion estimate. The altered k-space data set is then Fourier transformed as indicated at process block 206 to produce an image.

Figure 3:
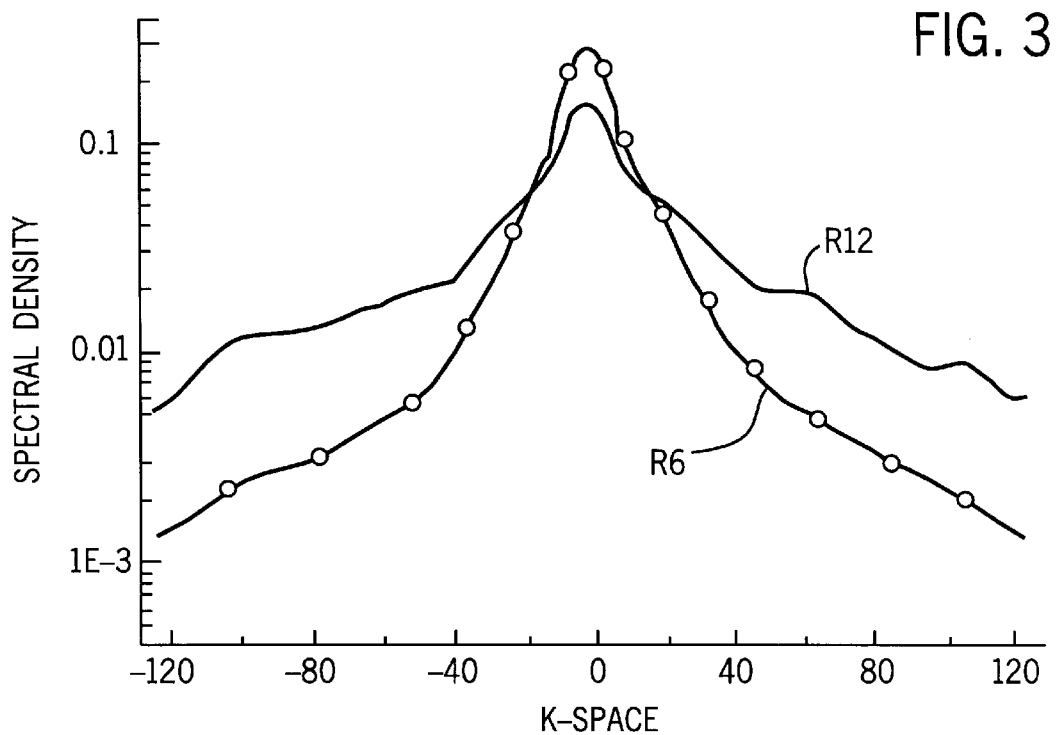
FIG. 3 is a graphic representation illustrating the change in metric value versus position in k-space of the views being phase shifted for two different metrics.

To evaluate the quality of the image an image metric is selected as indicated at process block 207. The image metric F(ky) is a function of spatial frequency. It is optimized to use the metric which is most sensitive in the spatial frequency range being corrected. As shown in FIG. 3, for example, at low spatial frequencies (i.e., center of k-space) entropy (metric R6) is more sensitive than gradient entropy (R12) and is used to evaluate these frequencies. On the other hand, at high spatial frequencies the sensitivity of these two metrics reverse, and the gradient entropy metric (R12) is used to evaluate image quality toward the edges of k-space. The metrics are stored in a library and may include, for example, two or more of the metrics indicated in the Appendix.

It should be apparent that other criteria can be established to take advantage of the attributes of particular metrics in the stored library. Some metrics converge to an optimal image faster than others as a function of the size of the phase correction made to the k-space data. Thus some metrics are preferred during initial iterations of the autocorrection method whereas others are preferred after initial corrections have been made. Another criteria is the size of the image artifacts being corrected. Some metrics converge faster when large artifacts are being corrected and others converge faster when small image artifacts are being corrected. In this case the mean signal value of pixels outside the boundary of the anatomy is used as a measure of artifact size.

As indicated at process block 208 in FIG. 2, the image metric is then calculated using the selected metric. If the calculated metric is within a preset tolerance as determined at decision block 210, the block of 64 views has been corrected and the next block of 64 views is selected as indicated at process block 212 and the process repeats. Otherwise, the motion estimate for this block is adjusted at process block 214 and the process is repeated to evaluate the image metric with the corresponding adjusted phase shift.

All blocks of k-space views are separately adjusted in phase starting at the center of k-space and working outward. When the last block has been corrected as determined at decision block 216, the block size is reduced in size as indicated at process block 218 and the system branches back to process block 202 to repeat the steps on the smaller block size. The process is repeated and the block size is reduced until the minimum block size has been processed as determined at decision block 220. In the preferred embodiment block size is divided by two after each iteration, and the minimum block size is one view. The corrected k-space data set is then Fourier transformed to reconstruct an optimal image as indicated at process block 222.

It should be apparent that the autocorrection method can be employed on one, two or three axes of motion. In many clinical applications of the method, it has been discovered that processing only a single axis of motion is necessary. This reduces the processing time considerably. For example, if the motion is primarily along the phase encoding direction, a one dimensional FFT along the readout gradient direction can be performed once on the acquired k-space image data set before the autocorrection method is applied. The phase corrections in process 204 are made on this hybrid-space data set and the Fourier transform in process 206 can be a one-dimensional FFT along the phase encoding gradient direction.

Also, in many clinical applications only a small portion of the reconstructed image is clinically important. The autocorrection method may be modified in this situation to evaluate the image metric in process block 208 only in the selected region of interest. That is, the operator identifies the pixels in the region of interest and the image metric is calculated only on these pixels. This reduces processing time and in some cases improves the resulting image in the critical region. This also enables the correction of images in which the motion is different in different regions of the image. In such cases each region may be separately corrected using the autocorrection method.

For example, the complete image may contain 256 columns of pixels which must be Fourier transformed each time the metric is to be calculated. If the region selected by the operator extends over only 64 columns of pixels, then only those 64 columns need be Fourier transformed during each evaluation iteration. This reduces the processing time by a factor of four.

The present invention also enables the autocorrections to be applied locally rather than globally to the entire image. Thus, local regions in the image can be separately corrected to further reduce processing time and tailor the correction to the particular motion in that region.

| Function | Description | Identifier Code |
|---|---|---|
| $F_1 = \sum_{ij}\left\| \begin{bmatrix} 1 \\ 0 \\ -1 \end{bmatrix} * g_{i,j} \right\|$ | Gradient | R1 |
| $F_2 = \sum_{ij}\left\| \begin{bmatrix} 1 \\ -1 \end{bmatrix} * g_{i,j} \right\|$ | Gradient | R2 |
| $F_3 = \sum_{ij}\left\| \begin{bmatrix} 1 \\ 2 \\ -1 \end{bmatrix} * g_{i,j} \right\|$ | Laplacian | R3 |
| $F_4 = \sum_{ij}\left\| \begin{bmatrix} -1 & -2 & -1 \\ -2 & 12 & -2 \\ -1 & -2 & -2 \end{bmatrix} * g_{i,j} \right\|$ | Laplacian | R4 |
| $F_5 = \sum_{ij}\left\| \begin{bmatrix} 0 & -1 & 0 \\ -1 & 4 & -1 \\ 0 & -1 & 0 \end{bmatrix} * g_{i,j} \right\|$ | Laplacian | R5 |
| $F_6 = -\sum_{ij} h_{i,j}\log_2[h_{i,j}]$ where $h_{i,j} = \dfrac{g_{i,mj}}{\sum_{ij} g_{i,j}^2}$ | Entropy | R6 |
| $F_7 = \sum_{i,j}\left(\dfrac{g_{i,j}}{\sum_{i,j} g_{i,j}}\right)^3$ | Cube of Normalized Intensities | R7 |

-continued

| Function | Description | Identifier Code |
|---|---|---|
| $F_8 = \sum_{i,j}\left(\dfrac{g_{i,j}}{\sum_{i,j} g_{i,j}}\right)^4$ | 4$^{th}$ Power of Normalized Intensities | R8 |
| $F_9 = \sum_{i,j}\left(\dfrac{g_{i,j}}{n}\right)^2$ | Squared Intensities | R9 |
| $F_{10} = \dfrac{\sum_{i,j}\left(\left[\begin{smallmatrix}1\\-1\end{smallmatrix}\right] * g_{i,j}\right)^2}{n}$ | Squared Gradient | R10 |
| $F_{11} = \dfrac{\sum_{i,j}\left(\left[\begin{smallmatrix}1\\-1\end{smallmatrix}\right] * g_{i,j}\right)^4}{n}$ | 4$^{th}$ Power of Gradient | R11 |
| $F_{12} = -\sum_{ij} h_{ij}\log_2[h_{i,j}]$ where $h_{i,j} = \left(\dfrac{\left\|\left[\begin{smallmatrix}1\\-1\end{smallmatrix}\right] * g_{i,j}\right\|}{\sum_{ij}\left\|\left[\begin{smallmatrix}1\\-1\end{smallmatrix}\right] * g_{i,j}\right\|}\right)$ | Gradient Entropy | R12 |
| $F_{13} = \sum_{ij}\left(\dfrac{\left\|\left[\begin{smallmatrix}1\\-1\end{smallmatrix}\right] * g_{i,j}\right\|}{\sum_{ij}\left\|\left[\begin{smallmatrix}1\\-1\end{smallmatrix}\right] * g_{i,j}\right\|}\right)^2$ | Normalized Gradient Squared | R13 |
| $F_{14} = \sum_{ij}\left(\dfrac{\left\|\left[\begin{smallmatrix}1\\-1\end{smallmatrix}\right] * g_{i,j}\right\|}{\sum_{ij}\left\|\left[\begin{smallmatrix}1\\-1\end{smallmatrix}\right] * g_{i,j}\right\|}\right)^4$ | Normalized Gradient to 4$^{th}$ Power | R14 |
| $F_{15} = \bar{b} = \sum_{b=0}^{L-1} bP(b)$ where $P(b)$ = histogram | Histogram Mean | H1 |
| $F_{16} = \sigma_h \sqrt{\sum_{b=0}^{L-1}(b-\bar{b})}$ | Histogram Standard Deviation | H2 |
| $F_{17} = \dfrac{1}{\sigma_h^3}\sum_{b=0}^{L-1}(b-\bar{b})^3 P(b)$ | Histogram Skewness | H3 |
| $F_{18} = \dfrac{1}{\sigma_h^4}\sum_{b=0}^{L-1}(b-\bar{b})^4 P(b) - 3$ | Histogram Kurtosis | H4 |
| $F_{19} = \sum_{b=0}^{L-1}[P(b)]^2$ | Histogram Energy | H5 |
| $F_{20} = \sum_{b=0}^{L-1} P(b)\log_2[P(b)]$ | Histogram Entropy | H6 |
| $F_{21} = \sqrt{\dfrac{1}{n(n-1)}\left(n\sum_{ij} g_{i,j}^2 - \left(\sum_{ij} g_{i,j}\right)^2\right)}$ | Standard Deviation | C1 |

-continued

| Function | Description | Identifier Code |
|---|---|---|
| $F_{22} = \sqrt{\frac{1}{n(n-1)}\left(n\sum_{ij} p_{i,j}^2 - \left(\sum_{ij} p_{i,j}\right)^2\right)}$ where $p_{ij}\begin{bmatrix} -1 & -1 & -1 \\ -1 & 9 & -1 \\ -1 & -1 & -1 \end{bmatrix} * g_{i,j}$ | Standard Deviation of Gradient | C2 |
| $F_{23} = \sum_{ij} g_{ij}^2 - \sum_{ij} g_{i,j} g_{i,j+1}$ | Autocorrection 1 | A1 |
| $F_{24} = \sum_{ij} g_{i,j} g_{i,j+1} - \sum_{ij} g_{i,j} g_{i,j+2}$ | Autocorrection | A2 |

\* = convolution
n = i,j, the total number of pixels in the image
$g_{i,j}$ = pixel value at co-coordinate i,j
R = Resolution,
H = Histogram,
C = Contrast,
A = Autocorrection

What is claimed is:

1. A method for correcting a medical image for artifacts, the steps comprising:
   a) acquiring a series of views to form an image data set;
   b) reconstructing an image from the acquired image data set;
   c) selecting a metric from a plurality of stored metrics;
   d) evaluating the quality of the reconstructed image by calculating a cost function using the selected metric; and
   e) iteratively minimizing the cost function by making corrections to the views in the image data set and repeating steps b), c), d) and e);

wherein a plurality of different metrics are selected in step c) and used in step d) during the iterations.

2. The method as recited in claim 1 in which the series of views are acquired on an MRI system and the image is reconstructed by performing a Fourier transformation.

3. The method as recited in claim 1 in which the artifacts are caused by patient motion.

4. The method as recited in claim 1 which includes selecting a region in the image which is to be corrected and performing steps c), d) and e) on the selected region.

5. The method as recited in claim 4 in which only a portion of the image containing said selected region is reconstructed in step b).

6. The method as recited in claim 4 which includes selecting a second region in the image which is to be corrected and performing steps c), d) and e) on the second region.

7. The method as recited in claim 1 in which the metric is selected in step c) based on pre-established criteria which are evaluated during each iteration.

8. The method as recited in claim 7 in which one of the pre-established criteria is the location in k-space of the views being corrected during each iteration.

9. The method as recited in claim 7 in which one of the pre-established criteria is the size of the artifact being corrected.

10. The method as recited in claim 7 in which one of the pre-established criteria is the number of iterations that have been performed.

11. The method as recited in claim 8 in which a metric that measures image entropy is selected when central k-space views are being corrected and a metric that measures the entropy of a gradient image is selected when peripheral k-space views are being corrected.

\* \* \* \* \*